United States Patent
Kobayashi (10) Patent No.: US 6,228,540 B1
(45) Date of Patent: May 8, 2001

(54) METHOD OF FORMING A PHOTOMASK OF HIGH DIMENSIONAL ACCURACY UTILIZING HEAT TREATMENT EQUIPMENT

(75) Inventor: Shinji Kobayashi, Nara (JP)

(73) Assignee: Sharpe Kabushiki Kaisha, Osaka (JP)

( * ) Notice: Subject to any disclaimer, the term of this patent is extended or adjusted under 35 U.S.C. 154(b) by 0 days.

(21) Appl. No.: 09/256,305

(22) Filed: Feb. 24, 1999

(30) Foreign Application Priority Data

Feb. 26, 1998 (JP) .................................................. 10-045667

(51) Int. Cl.⁷ ........................................................ G03F 9/00
(52) U.S. Cl. .................................................. 430/5; 430/330
(58) Field of Search ............................... 430/5, 296, 330; 378/34, 35; 165/80.1, 80.5

(56) References Cited

U.S. PATENT DOCUMENTS 5,766,824 * 6/1998 Batchelder et al. ................. 430/330
5,935,768 * 8/1999 Biche et al. ......................... 430/401

FOREIGN PATENT DOCUMENTS 60043655   8/1985   (JP) .
06216020   5/1994   (JP) .

* cited by examiner

Primary Examiner—Mark F. Huff
Assistant Examiner—Saleha R. Mohamedulla
(74) Attorney, Agent, or Firm—Nixon & Vanderhye P.C (57) ABSTRACT

Heat is supplied from a base plate located under a photomask blank to the photomask blank in a pre-baking process, and heat is partially supplied from an end surface use plate to the photomask blank so that the intra-planar temperature distribution of the photomask blank becomes uniform through correction of heat radiation from the end surface of the photomask blank. The photomask blank is cooled in a cooling process after the pre-baking process while partially supplying heat from the end surface use plate to the photomask blank so that the intra-planar temperature distribution of the photomask blank becomes uniform through the correction of heat radiation from the end surface of the photomask blank.

5 Claims, 8 Drawing Sheets

■ POSITIVE SHIFT AMOUNT RELATIVE TO INTRA-PLANAR DIMENSIONAL MEAN VALUE

□ NEGATIVE SHIFT AMOUNT RELATIVE TO INTRA-PLANAR DIMENSIONAL MEAN VALUE

Fig.11

METHOD OF FORMING A PHOTOMASK OF HIGH DIMENSIONAL ACCURACY UTILIZING HEAT TREATMENT EQUIPMENT

BACKGROUND OF THE INVENTION

The present invention relates to a photomask forming method and heat treatment equipment for forming a photomask where a resist pattern is formed on a photomask substrate.

When forming a resist pattern on a photomask substrate, an electron beam (referred to as EB hereinafter) resist has conventionally been used widely. This EB resist is not the so-called chemical amplification type resist but a polymeric material for effecting development by molecular weight difference through EB application. The thermophysical property of a positive type resist for removing the EB-applied portion by the development selectivity (molecular weight difference) will be described below.

Figure 4:
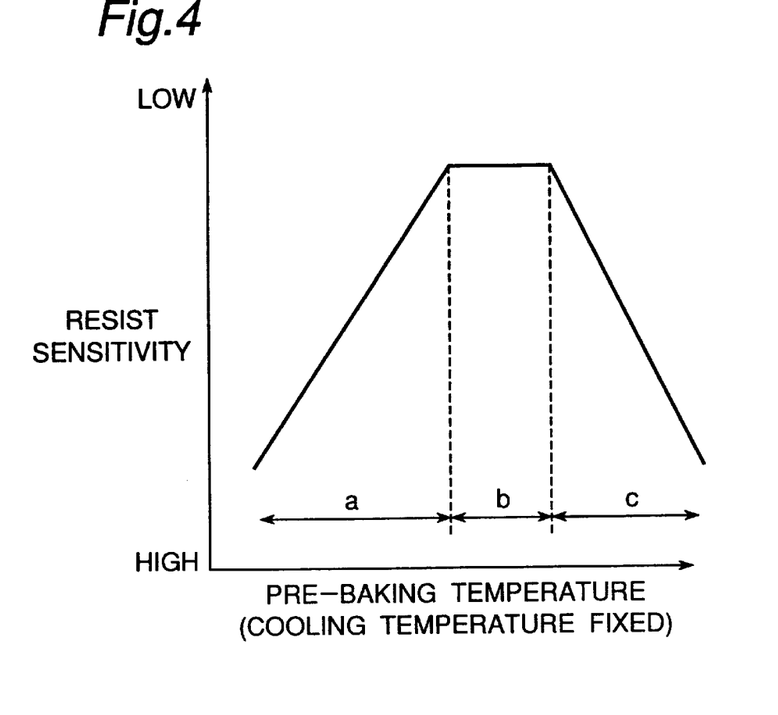
FIG. 4 is a graph showing a correlation between the pre-baking temperature and the resist sensitivity.

When PMMA (polymethyl methacrylate) which is a polymeric material of a hydrocarbon system is used as the EB resist, in a process of a baking (referred to as pre-baking hereinafter) of heat treatment after the application of the resist, there is observed a close relation between a prebaking temperature and a resist sensitivity as shown in FIG. 4. In FIG. 4, the horizontal axis represents the pre-baking temperature in an arbitrary scale, while the vertical axis represents the resist sensitivity in an arbitrary scale. In FIG. 4, the resist sensitivity reduces as a position in relation to the vertical axis ascends. In a temperature range "a" exceeding a glass transition point Tg of the EB resist, a portion (e.g., a double-bond portion on the side chain) having a weak bonding strength of the constituent elements in the resist is once broken in the pre-baking stage. The broken portion is recombined in its easily stabilized state (a slackly re-cross-linked state) into a polymer in a cooling stage after the pre-baking. This increases a cross-linking ratio in accordance with the increase in the pre-baking temperature, so that the EB resist is gradually reduced in sensitivity. In a temperature range "b" higher than the temperature range "a" shown in FIG. 4, the cross-linking becomes saturated, so that the sensitivity of the EB resist enters a stable region. Furthermore, in a temperature range "c" higher than the temperature range "b" shown in FIG. 4, the EB resist material itself is decomposed by the heat treatment in the pre-baking stage to have a reduced molecular weight, and this makes the resist have a high sensitivity.

Figure 5:
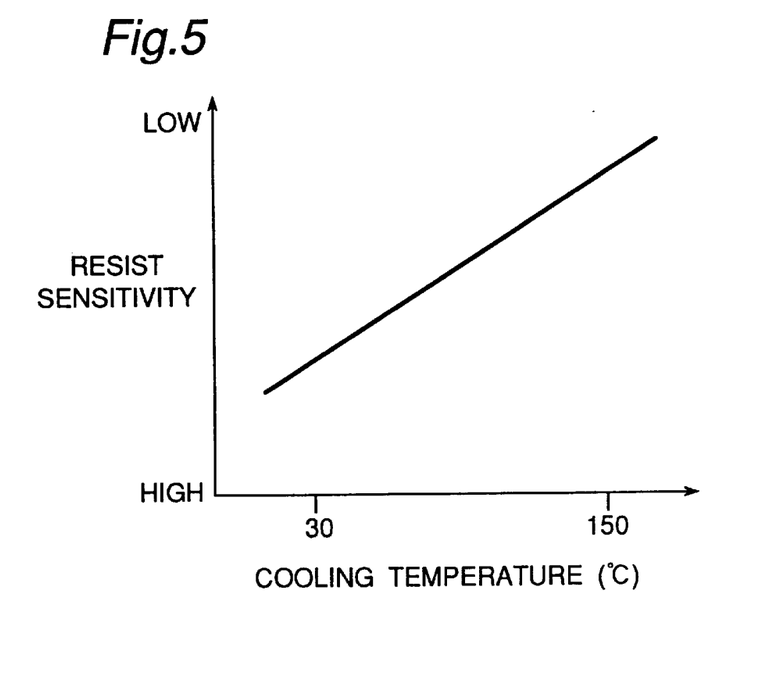
FIG. 5 is a graph showing a correlation between the cooling temperature and the resist sensitivity.

As shown in FIG. 5, there is observed a close relation between a cooling temperature and the resist sensitivity in a cooling process after the pre-baking process. In FIG. 5, the horizontal axis represents the cooling temperature, while the vertical axis represents the resist sensitivity in an arbitrary scale. As explained in connection with the temperature range "a" of FIG. 4, the cooling temperature after the pre-baking process dominates the polymeric bond state and the rate of progress of the cross-linking and operates as a very great factor for finally determining the resist sensitivity. This is because the rate of molecules that can be re-cross-linked in the cooling stage after the pre-baking process depends on a cooling rate, in particular, a rate of transition over the glass transition point. That is, the rate of progress of the cross-linking is determined by the cooling rate (cooling temperature). The cross-linking sufficiently progresses at the time of slow cooling, that is, at the time of the high cooling temperature, and therefore the EB resist comes to have a low sensitivity.

As described above, the sensitivity of the EB resist that is currently applied to the mass-production of photomasks depends on the pre-baking temperature in the pre-baking process and the cooling temperature in the subsequent cooling process. To accurately control the cooling temperature, which has no specific condition of stabilization in terms of thermophysics, is indispensable for obtaining a photomask of high dimensional accuracy.

Figure 6:
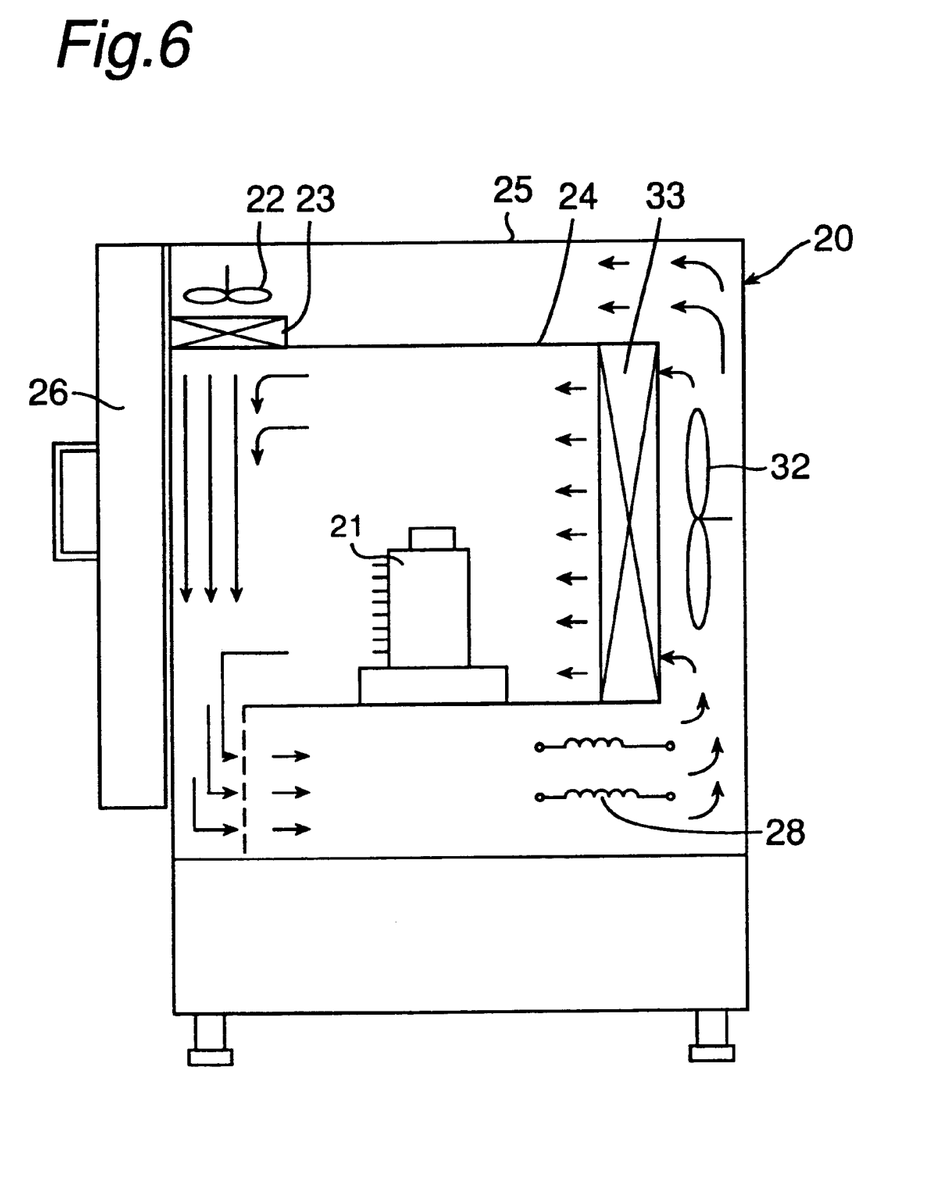
FIG. 6 is a sectional view showing a prior art convection type oven.
Figure 7:
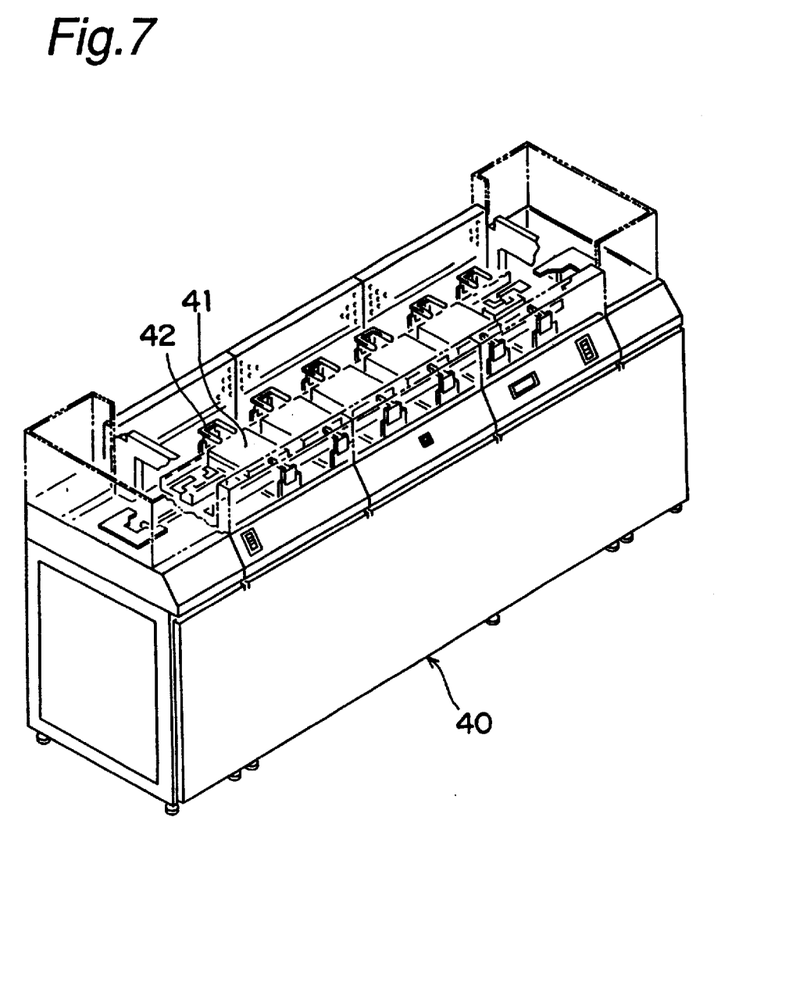
FIG. 7 is a perspective view of a prior art hot-plate oven.

For the method of forming a photomask using the above-mentioned EB resist, a convection type oven 20 as shown in FIG. 6 and a hot-plate oven 40 as shown in FIG. 7, each of which serves as heat treatment equipment, are widely used.

As shown in FIG. 6, the convection type oven 20 includes an inner vessel 24 arranged inside an outer vessel 25 having a door 26 and a heater 28 arranged on the lower side of the inner vessel 24 and operates to heat air by the heater 28 under the inner vessel 24 and circulate the heated air through a space between the inner vessel 24 and the outer vessel 25 by means of a fan 32 and a fan 22, thereby heating a photomask blank 21 arranged roughly at the center of the inner vessel 24, thereby a photomask blank 21 arranged generally at the center of the inner vessel 24 is heated. The convection type oven 20 is provided with filters 33 and 23 on the downwind side of the fans 32 and 22, respectively. Although the convection type oven 20 has the advantage that it can perform batch processing of a plurality of photomask blanks 21, it is structurally difficult to make uniform the intra-planar temperature distribution of the photomask blanks 21 due to the heat treatment by the convection inside the oven. The cooling process after a preheating process is generally performed by natural cooling inside a clean bench or the like. Therefore, it is actually impossible to achieve adjustment to the desired resist sensitivity, and variations in temperature of the photomask blanks 21 between photomasks and inside the photomask plane are also remarkable in the cooling stage.

FIG. 7 shows a perspective view of the hot-plate oven 40 of a horizontal plate placing system that solves the aforementioned problems. The hot-plate oven 40 has a plurality of base plates 41 arranged linearly and a conveyance arm 42 provided in the vicinity of each of the base plates 41 as shown in FIG. 7. By moving the photomask blank between the base plates 41 by means of the conveyance arm 42, the pre-baking process and the cooling process are sequentially performed.

Figure 8:
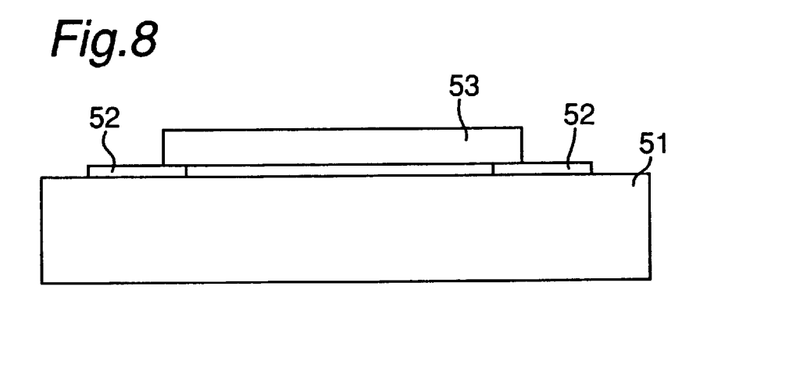
FIG. 8 is an enlarged sectional view of an essential part of the hot-plate oven.

FIG. 8 shows an enlarged sectional view of the essential part of the hot-plate oven 40 for performing the preheating process and the cooling process. Teflon (a trade name, PTFE) spacers 52 and 52 are arranged at a specified interval on a base plate 51. A photomask blank 53 is arranged horizontally so that both the end portions thereof are placed on the Teflon spacers 52 and 52. Thereby, a specified interval between the base plate 51 and the photomask blank 53 is placed by means of the Teflon spacers 52 and 52. Then, the base plate 51 under the photomask blank 53 is heated by a heater (not shown), thereby proximity-heating the photomask blank 53. According to the photomask forming method by means of this hot-plate oven 40, heat can be uniformly applied to the inside of the plane of the photomask blank 53. By setting the temperature of the base plate 51 to or around the normal temperature by water cooling or similar means, the method can also be applied to the cooling of the photomask blank 53. Therefore, taking advantage of the physical property of the EB resist shown in FIG. 5, the resist sensitivity can also be adjusted to the desired value by setting the temperature of the base plate 51 that serves as a cooling plate.

Figure 10:
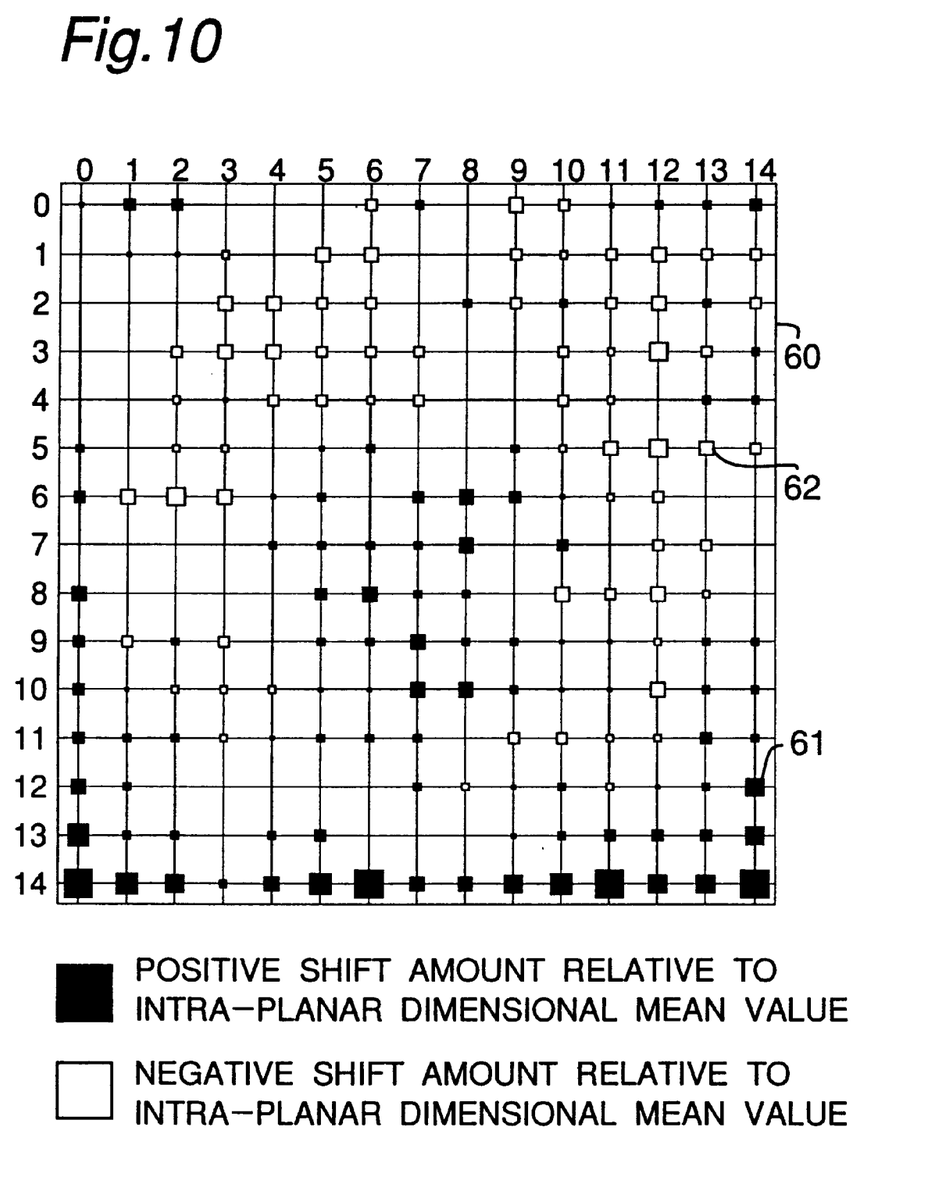
FIG. 10 is a view showing an intra-planar dimensional distribution in the case where a photomask blank of a plate thickness of 0.09 inch is subjected to the pre-baking process and the cooling process by the above hot-plate oven.

FIG. 10 shows an intra-planar dimensional distribution of a resist pattern formed by EB lithography using a photomask blank 60 of a plate thickness of 0.09 inch, which has undergone the pre-baking process and the cooling process in this hot-plate oven 40. In FIG. 10, the size of the hatched square mark 61 represents the positive shift amount relative to an intra-planar dimensional mean value, while the size of the white square mark 62 represents the negative shift amount relative to the intra-planar dimensional mean value. By uniform heat treatment for the photomask blank 60 in the pre-baking stage and the cooling stage, a satisfactory resist pattern intra-planar dimensional distribution can be obtained.

Figure 11:
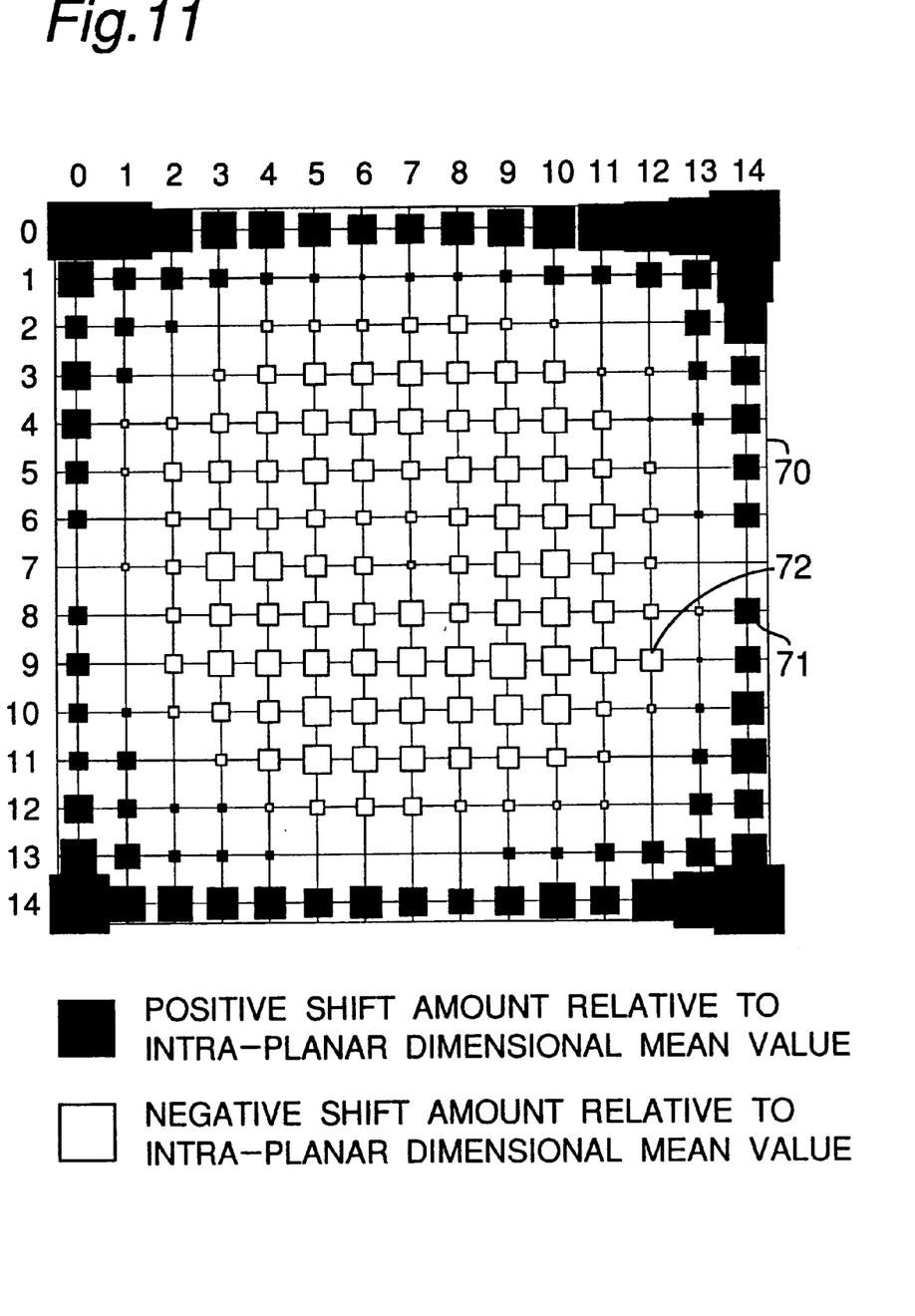
FIG. 11 is a view showing an intra-planar dimensional distribution in the case where a photomask blank of a plate thickness of 0.25 inch is subjected to the pre-baking process and the cooling process by the above hot-plate oven.

However, as shown in FIG. 11, if the resist pattern intra-planar dimensional distribution of a photomask blank 70 is observed after subjecting the photomask blank 70 of a plate thickness of 0.25 inch to similar pre-baking process and the cooling process, then there is a significant deviation (resist sensitivity: center portion<peripheral portion) in terms of the dimensional distribution of the resist pattern. This is ascribed to the resist that has come to have a high sensitivity in the peripheral portion as a consequence of a deterioration in the intra-planar temperature uniformity of the photomask blank 70 due to an increase in heat radiation from the end surface side of the photomask blank 70 because of the increased plate thickness of the photomask blank 70. It is to be noted that the size of the hatched square mark 71 represents the positive shift amount relative to the intra-planar dimensional mean value, while the size of the white square mark 72 represents the negative shift amount relative to the intra-planar dimensional mean value in FIG. 11.

Figure 9:
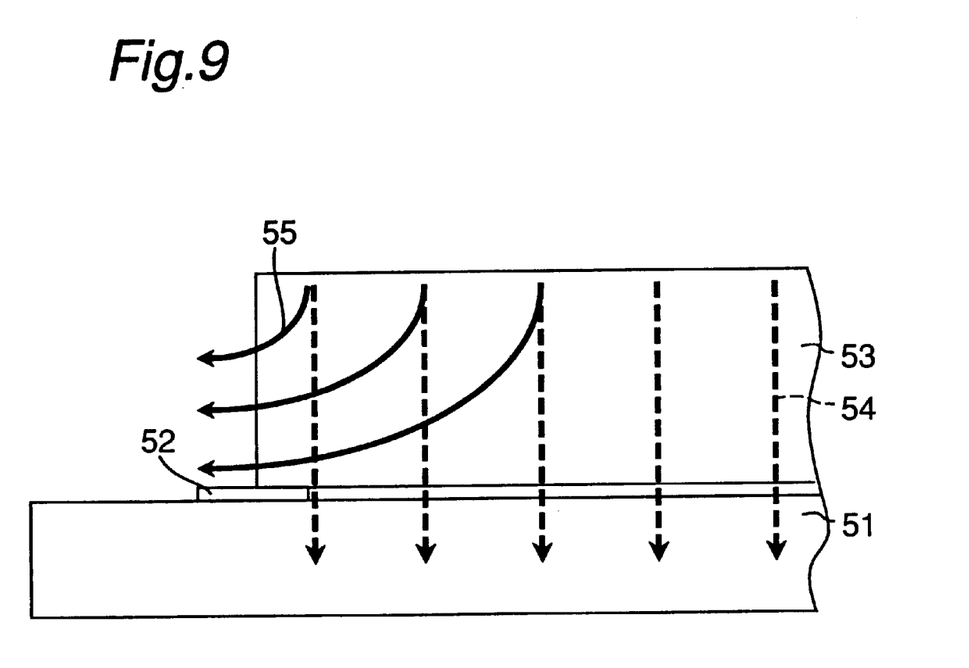
FIG. 9 is a view showing heat flow of a peripheral portion of a photomask blank in the cooling process of the hot-plate oven.

The cause of the dimensional distribution as shown in FIG. 11 will be described by means of a model representing heat flow shown in FIG. 9. FIG. 9 shows the cooling process after the pre-baking, which exerts a great influence on the resist sensitivity. The heat absorbing effect of the cooling plate of the aforementioned hot-plate oven 40 can be considered to be uniform with respect to the inside of the underside surface of the photomask blank 53. However, because of the presence of heat radiation 55 from the end surface portion of the photomask blank 53, the cooling rate becomes faster in the end surface portion than in the center portion of the photomask blank 53. This phenomenon becomes significant particularly in a photomask having a great plate thickness, and this phenomenon can be confirmed by the intra-planar temperature distribution by means of a thermograph. Due to this intra-planar temperature distribution nonuniformity of the photomask blank in the cooling stage, the resist located in the peripheral portion comes to have a high sensitivity relative to the center portion due to the thermophysical property of the aforementioned EB resist.

As a measure for preventing the deviation in the dimensional distribution of the photomask as described above for the purpose of uniforming the intra-planar temperature of the photomask blank through the prevention of heat radiation, there have been proposed the method of employing on the periphery of the photomask blank a frame-shaped member having the same heat conductivity (refer to the prior art reference of Japanese Patent Laid-Open Publication No. SHO 60-43655) and the method of providing a side plate for the end surface of the photomask blank (refer to the prior art reference of Japanese Patent Laid-Open Publication No. HEI 6-216020). However, the method of using the frame-shaped member having the same heat conductivity on the periphery of the photomask blank, although producing a great effect in uniforming the intra-planar temperature of the photomask blank, has the problem that an increase in size of the equipment cannot be avoided due to an increase in size of the board to be processed because of the employed frame-shaped member. The method of providing the side plate for the end surface of the photomask blank has the problem that the intra-planar temperature uniformity of the photomask blank is insufficient since the outward heat radiation from the end surface of the photomask blank cannot be sufficiently avoided particularly in the cooling stage.

The dimensional accuracy of the photomask is defined by the intra-planar dimensional accuracy and the amount of deviation of the mean value of the intra-planar dimension from a target dimension, and the amount of deviation from the target dimension can be corrected to some extent by adjusting the exposure light quantity in a photoresist process on a wafer. However, in regard to the intra-planar dimensional accuracy, the whole surface of the photomask is subjected to exposure of a single light quantity, and therefore, the dimensional deviation is transferred as it is onto the wafer. Therefore, in order to obtain high dimensional accuracy in the photoresist process on the wafer, it is most important to assure the intraplanar dimensional accuracy of the photomask.

SUMMARY OF THE INVENTION

The object of the present invention is to provide a photomask forming method and heat treatment equipment capable of forming a photomask having a resist pattern of high dimensional accuracy by improving the intra-planar temperature uniformity of a photomask blank in a heat treatment stage even if the photomask has a great plate thickness.

In order to achieve the above-mentioned object, the present invention provides a photomask forming method comprising:

a heating process for supplying heat from a first heat source located under a horizontally placed photomask board whose surface is coated with a resist to the photomask board and partially supplying heat to the photomask board from a second heat source located outside an end surface of the photomask board so that an intra-planar temperature distribution of the photomask board becomes approximately uniform through correction of heat radiation from the end surface side of the photomask board; and a cooling process for cooling the photomask board while partially supplying heat to the photomask board from the second heat source located outside the end surface of the photomask board so that the intra-planar temperature distribution of the photomask board becomes approximately uniform through the correction of the heat radiation from the end surface side of the photomask board after the heating process.

According to the photomask forming method of the invention, by supplying heat in the heating process from the first heat source located under the horizontally placed photomask board whose surface is coated with the resist to the photomask board and partially supplying heat to the photomask board from the second heat source located outside the end surface of the photomask board for the correction of the heat radiation from the end surface side of the photomask board, the intra-planar temperature distribution of the photomask board is made approximately uniform. When cooling the photomask board in the cooling process after the heating process, by partially supplying heat to the photomask board from the second heat source located outside the end surface of the photomask board for the correction of the heat radiation from the end surface side of the photomask board, the intra-planar temperature distribution of the photomask board is made approximately uniform. As described above, by making uniform the intra-planar temperature distribution of the photomask board in the heating process and the cooling process, a cross-linking ratio that determines the resist sensitivity is made uniform within the plane of the photomask board, thereby making uniform the resist sensitivity within the plane of the photomask board. With this arrangement, a photomask having a resist pattern of high dimensional accuracy can be formed through the subsequent exposure-to-light and development processes even with a photomask of a great plate thickness without dimensionally increasing the equipment. By using this photomask in the photoresist process on the wafer, high dimensional accuracy can be obtained. Even with a photomask board of a great thickness (0.25 inch, for example), resist pattern dimensional accuracy uniformed within a plane can be obtained, by which the dimensional accuracy of a 6-inch photomask (stepper use reticle) that is currently going mainstream can be remarkably improved.

In an embodiment of the present invention, there is provided a photomask forming method, wherein a temperature of the second heat source is set lower than a temperature of the first heat source in the heating process, and the temperature of the second heat source is set higher than the temperature of the first heat source in the cooling process.

According to the photomask forming method of the embodiment, part of the heat supplied from the first heat source to the photomask board is discharged from the end surface side of the photomask board to the outside at the end surface portion of the photomask board in the heating process. Therefore, by setting the temperature of the second heat source lower than the temperature of the first heat source, a heat quantity corresponding to the heat radiation from the end surface portion of the photomask board is correctly supplied to the photomask board. If the temperature of the second heat source and the temperature of the first heat source are made identical to each other in, for example, the cooling process, then the heat is discharged from the photomask board to the first heat source side at the end surface portion of the photomask board and heat is similarly discharged from the end surface side of the photomask board to the outside. Therefore, the heat radiation from the end surface side of the photomask board cannot be sufficiently compensated for, as a consequence of which the cooling rate becomes faster in the peripheral portion than in the center portion of the photomask board. Therefore, by setting the temperature of the second heat source higher than the temperature of the first heat source, the heat quantity corresponding to the heat radiation from the end surface portion of the photomask board is correctly supplied to the photomask board. Therefore, the intra-planar temperature distribution of the photomask board can be made further uniform.

The present invention also provides heat treatment equipment comprising:

a base plate that is arranged under a horizontally placed photomask board whose surface is coated with a resist and supplies heat to the photomask board from below; and an end surface use plate that is arranged on an end surface side of the photomask board and partially supplies heat laterally to the photomask board so that an intra-planar temperature distribution of the photomask board becomes approximately uniform through correction of heat radiation from the end surface side of the photomask board.

According to the heat treatment equipment of the invention, by supplying heat in the heating process from the base plate located under the horizontally placed photomask board whose surface is coated with the resist to the photomask board and partially supplying heat to the photomask board from the end surface use plate located outside the end surface of the photomask board for the correction of the heat radiation from the end surface side of the photomask board, the intra-planar temperature distribution of the photomask board is made approximately uniform. When cooling the photomask board in the cooling process after the heating process, by partially supplying heat to the photomask board from the end surface use plate located outside the end surface of the photomask board for the correction of the heat radiation from the end surface side of the photomask board, the intra-planar temperature distribution of the photomask board is made approximately uniform. As described above, by making uniform the intra-planar temperature distribution of the photomask board in the heating process and the cooling process, the cross-linking ratio that determines the resist sensitivity is made uniform within the plane of the photomask board, thereby making uniform the resist sensitivity within the plane of the photomask board. With this arrangement, a photomask having a resist pattern of high dimensional accuracy can be formed through the subsequent exposure-to-light and development processes even with a photomask of a great plate thickness without dimensionally increasing the equipment. By using this photomask in the photoresist process on the wafer, high dimensional accuracy can be obtained. Even with a photomask board of a great thickness (0.25 inch, for example), resist pattern dimensional accuracy uniformed within a plane can be obtained, by which the dimensional accuracy of a 6-inch photomask (stepper use reticle) that is currently going mainstream can be remarkably improved.

In an embodiment of the present invention, there is provided heat treatment equipment, wherein a temperature of the end surface use plate is set lower than a temperature of the base plate when supplying heat to the photomask board from the base plate located under the photomask board and partially supplying heat laterally to the photomask board by means of the end surface use plate so that the intra-planar temperature distribution of the photomask board becomes approximately uniform through the correction of the heat radiation from the end surface side of the photomask board, and the temperature of the end surface use plate is set higher than the temperature of the base plate when cooling the photomask board while partially supplying heat laterally to the photomask board by means of the end surface use plate so that the intra-planar temperature distribution of the photomask board becomes approximately uniform through the correction of the heat radiation from the end surface side of the photomask board.

According to the heat treatment equipment of the embodiment, part of the heat supplied from the base plate to the photomask board is discharged from the end surface side of the photomask board to the outside at the end surface portion of the photomask board in the heating process. Therefore, by setting the temperature of the end surface use plate lower than the temperature of the base plate, a heat quantity corresponding to the heat radiation from the end surface portion of the photomask board is correctly supplied to the photomask board. If the temperature of the end surface use plate and the temperature of the base plate are made identical to each other in, for example, the cooling process, then the heat is discharged from the photomask board to the base plate side at the end surface portion of the photomask board and heat is similarly discharged from the end surface side of the photomask board to the outside. Therefore, the heat radiation from the end surface side of the photomask board cannot be compensated for, as a consequence of which the cooling rate becomes faster in the peripheral portion than in the center portion of the photomask board. Therefore, by setting the temperature of the end surface use plate higher than the temperature of the base plate, the heat quantity corresponding to the heat radiation from the end surface portion of the photomask board is correctly supplied to the photomask board. Therefore, the intra-planar temperature distribution of the photomask board can be further uniformed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The photomask forming method and heat treatment equipment of the present invention will be described in detail below on the basis of the embodiments thereof shown in the drawings.

Figure 1A:
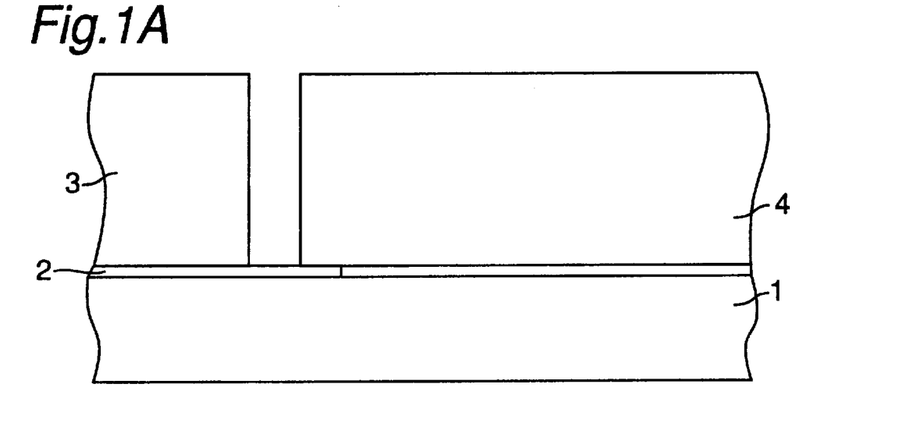
FIG. 1A is an enlarged sectional view of a peripheral portion of a photomask blank in a hot-plate oven that serves as heat treatment equipment used for a photomask forming method according to an embodiment of the present invention.
Figure 1B:
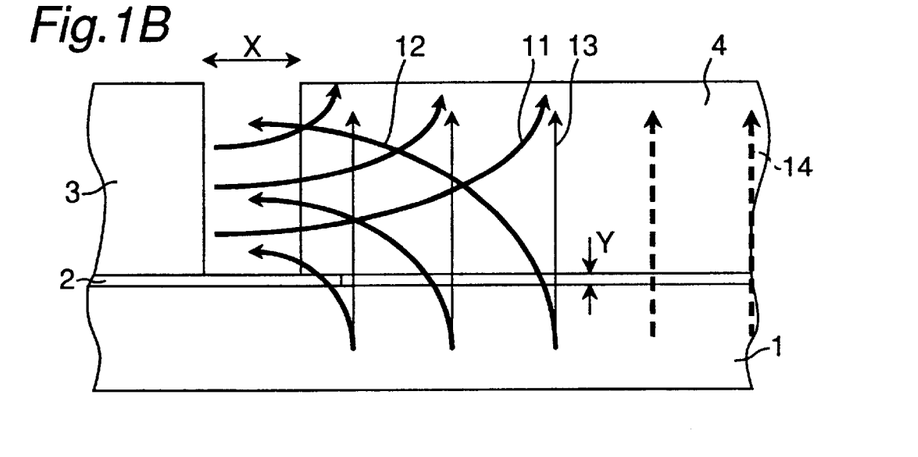
FIG. 1B is a view showing a model of heat radiation and heat supply at the peripheral portion of the photomask blank in a pre-baking process.
Figure 1C:
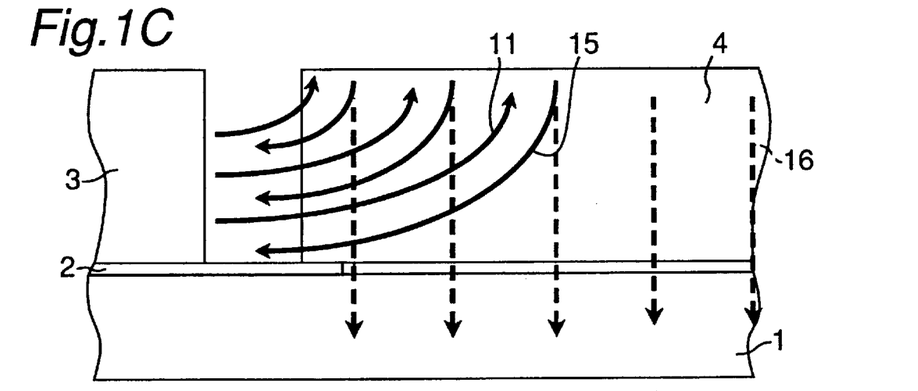
FIG. 1C is a view showing a model of heat radiation and heat supply at the peripheral portion of the photomask blank in a cooling process.
Figure 2:
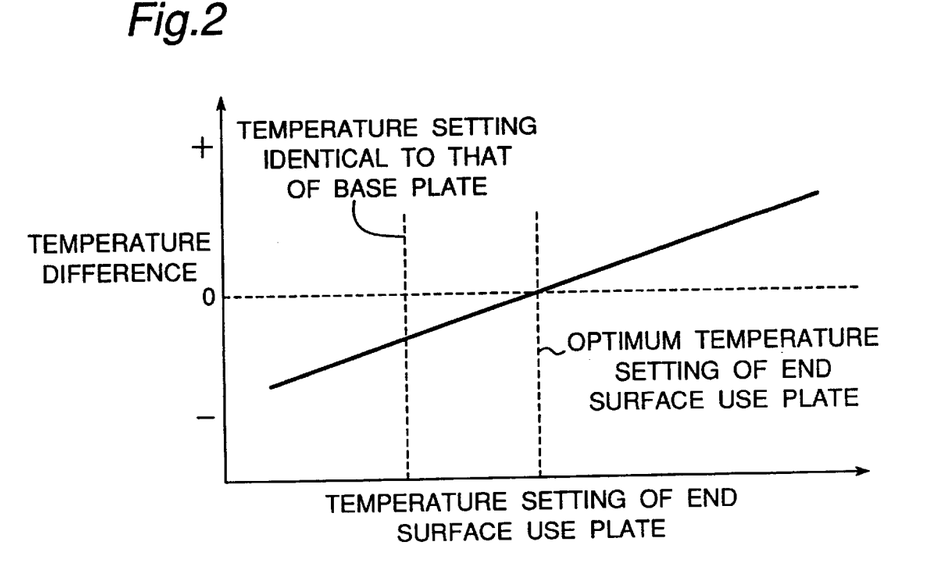
FIG. 2 is a graph showing a correlation between setting temperature of an end surface use plate and temperature difference between temperature in the peripheral portion and temperature in the center portion of the photomask blank in the cooling process.
Figure 3:
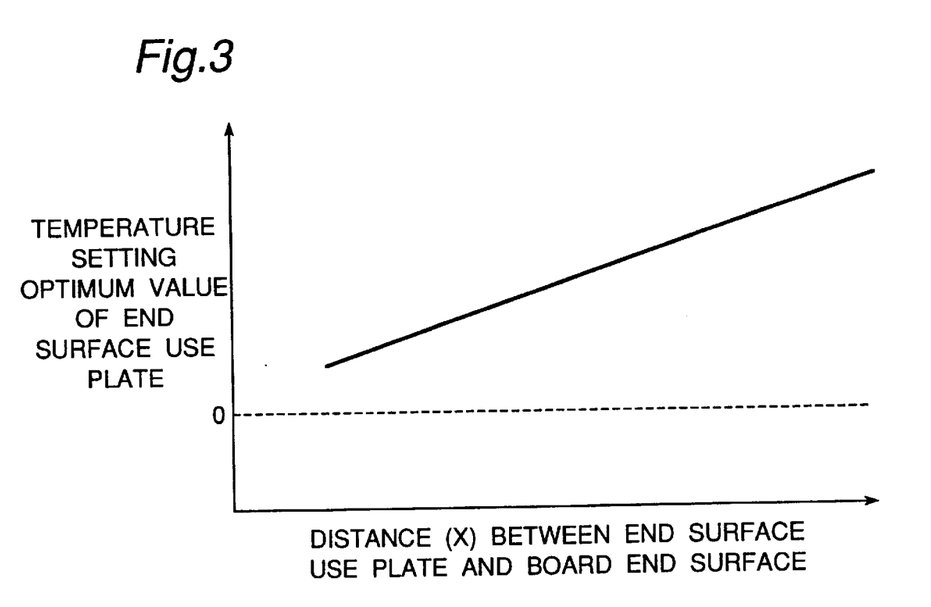
FIG. 3 is a graph showing a correlation between a distance from the end surface use plate to the end surface of the board (photomask blank) and a temperature setting optimum value of the end surface use plate in the cooling process.

FIG. 1A is a sectional view of a peripheral portion of a photomask blank in a hot-plate oven that serves as heat treatment equipment used for a photomask forming method according to an embodiment of the present invention. FIG. 1B is a view showing a model of heat radiation and heat supply at the peripheral portion of the photomask blank in a pre-baking process. FIG. 1C is a view showing a model of heat radiation and heat supply at the peripheral portion of the photomask blank in a cooling process. It is to be noted that the hot-plate oven has the same construction as that of FIG. 7 except for the base plate and the peripheral portion of the photomask blank.

In FIG. 1A are shown a base plate 1 that serves as a first heat source, thin film heat insulating materials 2 (only one of which is shown in FIG. 1A) arranged on the base plate 1 at specified intervals, an end surface use plate 3 that serves as a second heat source arranged on the thin film heat insulating material 2 and a horizontally placed photomask blank 4 the end portion of which is supported on the thin film heat insulating material 2 and the end surface of which is placed at a specified interval apart from the end surface use plate 3. The photomask blank 4 is a photomask board obtained by vapor depositing chrome or the like on a glass substrate and coating an EB resist on the vapor deposit. The base plate 1 and the end surface use plate 3, which have structures that can be thermally separably controlled, are allowed to have separate temperature settings.

The pre-baking process will be described first with reference to FIG. 1B. FIG. 1B shows heat flow in the pre-baking process. In this pre-baking process, in the neighborhood of the end surface of the photomask blank 4, heat supply 14 from the base plate 1 to the photomask blank 4 is separated into heat supply 13 to the inside of the photomask blank 4 and heat radiation 12 from the end surface portion of the photomask blank 4 to the outside. Heat supply 11 from the end surface use plate 3 to the end surface portion of the photomask blank 4 is effected so that the intra-planar temperature distribution of the photomask blank 4 becomes uniform through correction of a heat loss due to the heat radiation 12 to the outside. In this stage, the setting temperature of the end surface use plate 3 depends on a ratio of an interval X between the end surface use plate 3 and the photomask blank 4 and an interval Y between the base plate 1 and the photomask blank 4. For example, in the case where X=Y, the heat loss can be corrected by a setting temperature lower than the setting temperature of the base plate 1.

The cooling process will be described next with reference to FIG. 1C. In FIG. 1C, there is the heat radiation 15 from the end surface portion of the photomask blank 4 aside from heat radiation 16 from the photomask blank 4 to the base plate 1 in the cooling process. Heat supply 11 for correcting this heat loss is effected from the end surface use plate 3. In the case where the interval X and the interval Y are approximately equal to each other in this cooling process, the setting temperature of the end surface use plate 3 is set to a temperature higher than the setting temperature of the base plate 1 so as to correct the heat loss, and the correction of the heat loss allows the plane of the photomask blank 4 to have a uniform temperature distribution. It is to be noted that the setting temperature of the end surface use plate 3 is required to be higher as the interval X between the end surface use plate 3 and the photomask blank 4 increases.

As described above, by correctly supplying the heat quantity corresponding to the heat radiation from the end surface portion of the photomask blank 4 to the photomask blank 4, the intra-planar temperature distribution of the photomask blank 4 is made uniform and the cross-linking ratio that determines the resist sensitivity is made uniform within the plane of the photomask blank 4, thereby making uniform the resist sensitivity within the plane of the photomask blank 4. Therefore, the intra-planar temperature distribution of the photomask blank 4 can be made uniform even with a photomask having a great plate thickness without dimensionally increasing the equipment, thereby allowing a photomask having a resist pattern of high dimensional accuracy to be formed through the subsequent exposure-to-light and development processes. Even with a photomask board of a great thickness (0.25 inch, for example), resist pattern dimensional accuracy uniformily within a plane can be obtained, by which the dimensional accuracy of a 6-inch photomask (stepper use reticule) that is currently going mainstream can be remarkably improved. By using this photomask in the photoresist process on the wafer, high dimensional accuracy can be obtained, thereby allowing the yields of mass-produced LSI chips to be remarkably improved.

Furthermore, by setting the temperature of the end surface use plate 3 lower than the temperature of the base plate 1 in the pre-baking process, the heat radiation from the end surface side of the photomask blank 4 is compensated for. By setting the temperature of the end surface use plate 3 higher than the temperature of the base plate 1 in the cooling process, the heat quantity corresponding to the heat radiation from the end surface portion of the photomask board is correctly supplied to the photomask board. Therefore, the intra-planar temperature distribution of the photomask blank can be made further uniform.

The invention being thus described, it will be obvious that the same may be varied in many ways. Such variations are not be regarded as a departure from the sprit and scope of the invention, and all such modifications as would be obvious to one skilled in the art are intended to be included within the scope of the following claims.

What is claimed is:

1. A photomask forming method comprising:
   a heating process for supplying heat from a first heat source located under a horizontally placed photomask board whose surface is coated with a resist to the photomask board and supplying heat to a portion of the photomask board from a second heat source located outside and to a side of an end surface of the photomask board so that an intra-planar temperature distribution of the photomask board becomes approximately uniform through compensation for heat radiation from the end surface side of the photomask board; and
   a cooling process for cooling the photomask board while supplying heat to a portion of the photomask board from the second heat source device located outside and to the side of the end surface of the photomask board so that the intra-planar temperature distribution of the photomask board becomes approximately uniform through the compensation for the heat radiation from the end surface side of the photomask board after the heating process.

2. A photomask forming method as claimed in claim 1, wherein
   a temperature of the second heat source is set lower than a temperature of the first heat source in the heating process, and
   the temperature of the second heat source is set higher than the temperature of the first heat source in the cooling process.

3. A photomask forming method comprising:
   a heating process for supplying heat from a first heat source located under a horizontally placed photomask board whose surface is coated with a resist to the photomask board and supplying heat to a portion of the photomask board from a second heat source located outside an end surface of the photomask board so that an intra-planar temperature distribution of the photomask board becomes approximately uniform through compensation for heat radiation from the end surface side of the photomask board; and
   a cooling process for cooling the photomask board while supplying heat to a portion of the photomask board from the second heat source located outside the end surface of the photomask board so that the intra-planar temperature distribution of the photomask board becomes approximately uniform through the compensation for the heat radiation from the end surface side of the photomask board after the heating process,
   wherein the temperature of the second heat source is determined by a ratio of a first interval between the second heat source and the photomask board and a second interval between the first heat source and the photomask board.

4. The photomask forming method as claimed in claim 3, wherein the first interval equals the second interval, such that the temperature of the second heat source is lower than the temperature of the first heat source during the heating process.

5. The photomask forming method as claimed in claim 3, wherein the first interval equals the second interval, such that the temperature of the second heat source is higher than the temperature of the first heat source during the cooling process.

* * * * *

UNITED STATES PATENT AND TRADEMARK OFFICE
CERTIFICATE OF CORRECTION

PATENT NO. : 6,228,540 B1
DATED : May 8, 2001
INVENTOR(S) : Kobayashi

Page 1 of 1

It is certified that error appears in the above-identified patent and that said Letters Patent is hereby corrected as shown below:

<u>Title page,</u>
Item [73], Assignee, delete "Sharpe Kabushiki Kaisha, Osaka (JP)", add -- Sharp Kabushiki Kaisha, Osaka (JP) --

Signed and Sealed this

Second Day of April, 2002

Attest:

JAMES E. ROGAN
*Attesting Officer*  *Director of the United States Patent and Trademark Office*